US012713608B2

(12) United States Patent
Kim et al.

(10) Patent No.: US 12,713,608 B2
(45) Date of Patent: Aug. 18, 2026

(54) THREE-DIMENSIONAL MEMORY DEVICE HAVING STAIRWAY STRUCTURES

(71) Applicant: SK hynix Inc., Icheon-si (KR)

(72) Inventors: Jin Ho Kim, Icheon-si (KR); Sang Hyun Sung, Icheon-si (KR); Go Hyun Lee, Icheon-si (KR); Byung Hyun Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 370 days.

(21) Appl. No.: 18/410,756

(22) Filed: Jan. 11, 2024

(65) Prior Publication Data

US 2025/0120079 A1 Apr. 10, 2025

(30) Foreign Application Priority Data

Oct. 5, 2023 (KR) ........................ 10-2023-0132335

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/40*** | (2023.01) |
| ***H10B 43/10*** | (2023.01) |
| ***H10B 43/40*** | (2023.01) |
| ***H10W 20/41*** | (2026.01) |
| ***H10W 20/42*** | (2026.01) |

(52) U.S. Cl.

CPC ............. *H10B 43/27* (2023.02); *H10B 41/10* (2023.02); *H10B 41/27* (2023.02); *H10B 41/40* (2023.02); *H10B 43/10* (2023.02); *H10B 43/40* (2023.02); *H10W 20/42* (2026.01); *H10W 20/435* (2026.01)

(58) Field of Classification Search

CPC ........ H10B 43/27; H10B 41/10; H10B 41/27; H10B 41/40; H10B 43/10; H10B 43/40; H10B 41/50; H10B 43/50; H10W 20/42; H10W 20/435

See application file for complete search history.

(56) References Cited

U.S. PATENT DOCUMENTS

| | | | | |
|---|---|---|---|---|
| 2019/0341399 | A1* | 11/2019 | Tao | H10B 43/10 |
| 2020/0135749 | A1* | 4/2020 | Hwang | H10B 41/27 |
| 2021/0151462 | A1* | 5/2021 | Baek | H10B 41/50 |
| 2021/0183770 | A1 | 6/2021 | Kim et al. | |
| 2022/0020762 | A1* | 1/2022 | Son | H10B 43/10 |

(Continued)

*Primary Examiner* — Yasser A Abdelaziez

(57) ABSTRACT

A three-dimensional memory device includes first and second isolation patterns extending in a first direction, and adjacent to each other in a second direction intersecting with the first direction; a stack disposed between the first isolation pattern and the second isolation pattern, and including a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses comprises a first stairway structure connected to the first isolation pattern, a second stairway structure connected to the second isolation pattern, and a sidewall connecting the first stairway structure and the second stairway structure and disposed in the insulating region.

20 Claims, 13 Drawing Sheets

(56) References Cited

U.S. PATENT DOCUMENTS

2022/0045083 A1* 2/2022 Sim ........................ H10B 43/50
2023/0092799 A1* 3/2023 Tanaka ............... G11C 16/0483
257/314

* cited by examiner

FIG.1
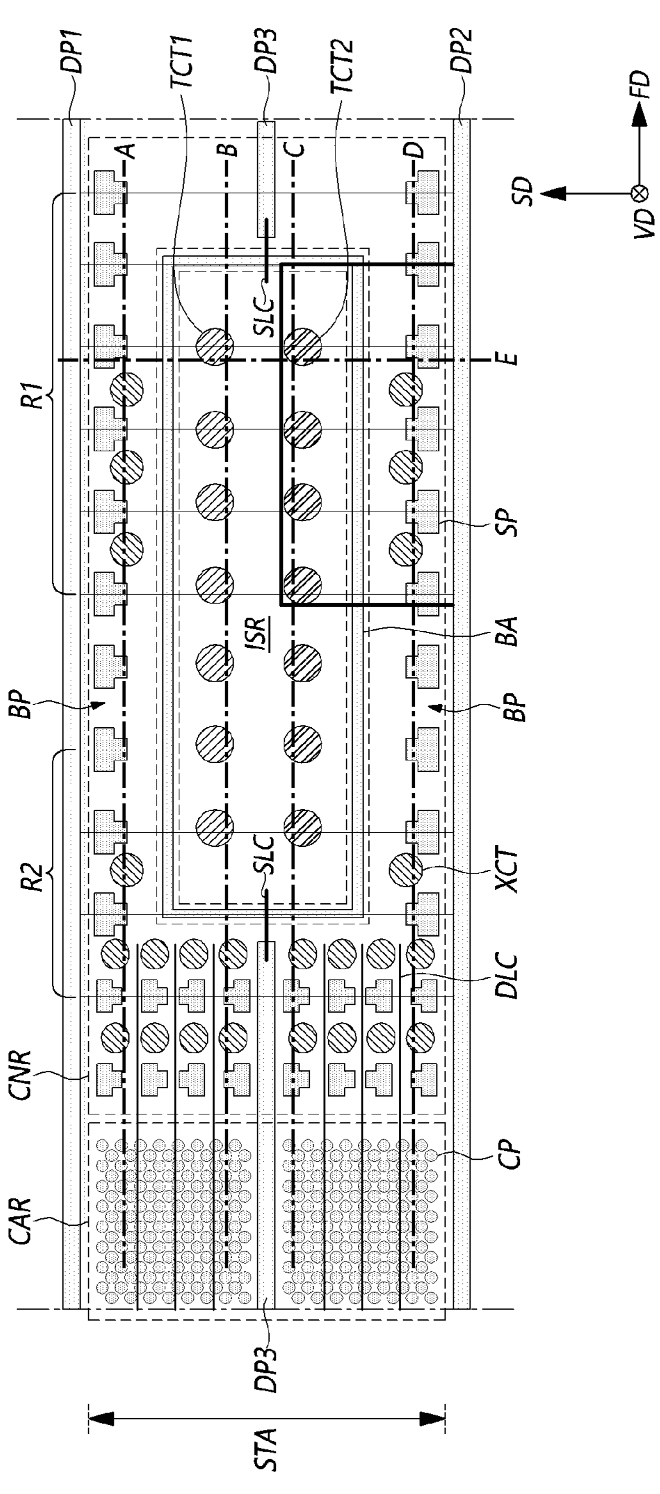

R1
CSW
ST1
ST2
22
21
BA
CNR
ISR
CNR
R2
ST3
DLC
DP3
11
12
STA
X
X
X
VD
SD
FD 11
12
30
FD
VD
SD
DP
R1
ST1
LP
XCT
CNR
DP
R2
ST3
LP
CAR
CP
STA

CNR
ISR
CNR
CAR
R1
R2
TCT1
22
21
BA
LP
CP
STA
11
12
30
FD
VD
SD
ST1
DCC
40
ST3

11
12
30
FD
VD
SD
CNR
R1
ST2
TCT2
DCC
40
ISR
22
21
R2
ST3
BA
LP
CNR
CAR
CP
STA 11
12
30
FD
VD
SD
DP
R1
ST2
LP
XCT
CNR
DP
R2
ST3
LP
CP
CAR
STA

TCT1
TCT2
FD
SD
VD
R1
ISR
R2
CNR
CAR
STA

FIG.9
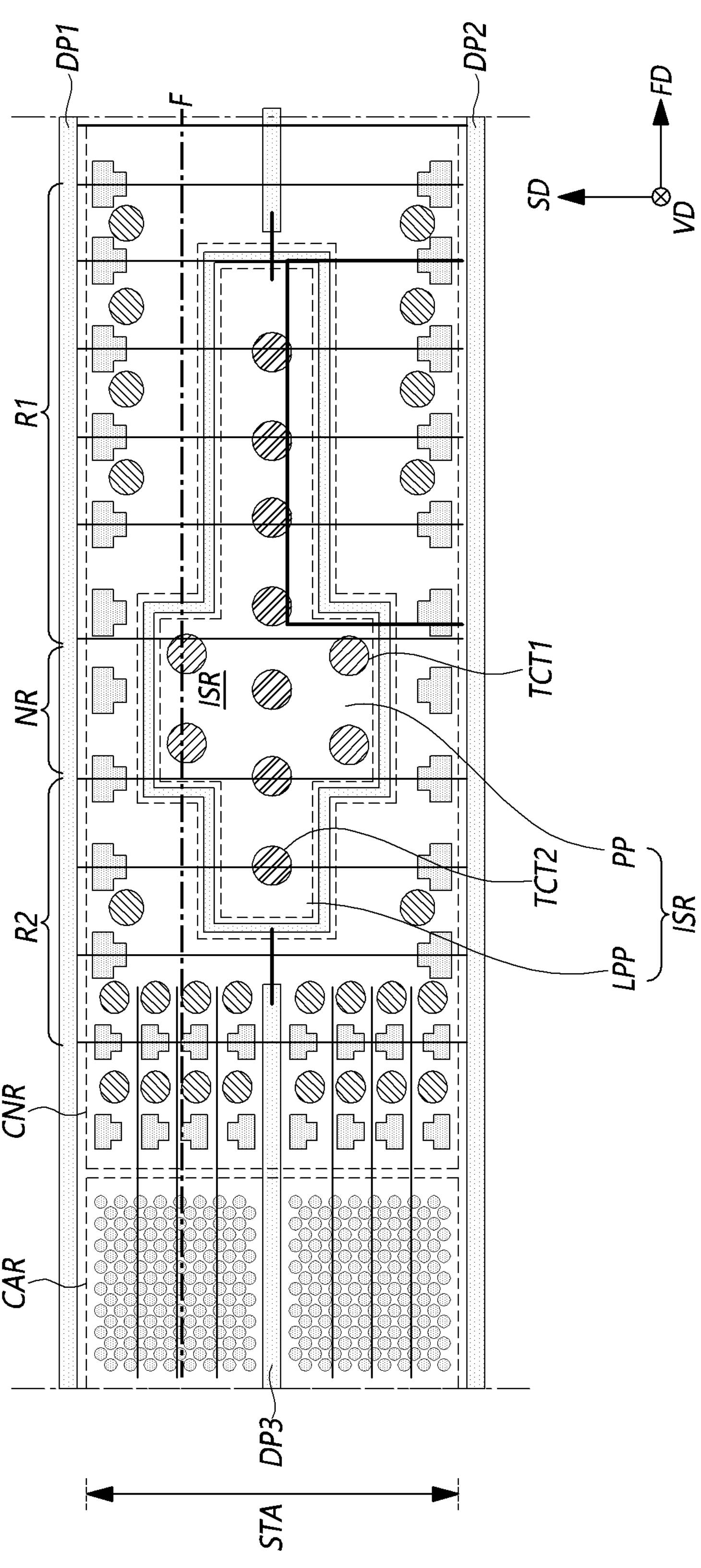
DP1
DP2
F
FD
SD
VD
R1
NR
R2
CNR
CAR
ISR
TCT1
PP
TCT2
LPP
ISR
DP3
STA 11
12
30
FD
VD
SD
CNR
R1
ISR
NR
DCC
22
TCT1
21
R2
CNR
CAR
CP
STA

TCT2A
TCT2B
TCT2
TCT2A
ISR
A
TCT1
TCT2B
CNR
CAR
FD
SD
VD
STA

M2
50
DCC
30
TCT1
M1
BNL2
BNL1
BS
UM3
130
UM2
UM1
120
110
60
40
210
140
TR
STA
CBC
CBD
PBD
PBC
200A
100A

THREE-DIMENSIONAL MEMORY DEVICE HAVING STAIRWAY STRUCTURES

CROSS-REFERENCE TO RELATED APPLICATION

The present application claims priority under 35 U.S.C. § 119(a) to Korean Patent Application No. 10-2023-0132335 filed in the Korean Intellectual Property Office on Oct. 5, 2023, which is incorporated herein by reference in its entirety.

BACKGROUND

1. Technical Field

Various embodiments generally relate to a semiconductor technology, and more particularly, to a three-dimensional memory device and a manufacturing method thereof.

2. Related Art

A semiconductor memory device with a two-dimensional or planar structure has been developed to store more data in the same area by using a fine patterning process. However, as the line width of a circuit is narrowed due to the demand for a higher degree of integration, interference between memory cells becomes increases and causes various limitations or problems such as degradation in performance. In addition to such structural limitations, an increase in manufacturing cost is inevitable because of expensive equipment that is required to pattern increasing narrow fine lines.

To overcome such limitations of the two-dimensional semiconductor memory devices, a three-dimensional semiconductor memory device has been proposed. A three-dimensional memory device has advantages in that a larger capacity may be realized within the same area by stacking memory cells in a vertical direction, thereby increasing the number of stacks and providing higher performance and excellent power efficiency.

SUMMARY

Various embodiments of the disclosed technology are directed to suggesting a three-dimensional memory device with improved degree of integration and reliability and methods of manufacturing such devices.

In an embodiment, a three-dimensional memory device may include: first and second isolation patterns extending in a first direction, and adjacent to each other in a second direction intersecting with the first direction; a stack disposed between the first isolation pattern and the second isolation pattern that comprises a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses includes a first stairway structure connected to the first isolation pattern, a second stairway structure connected to the second isolation pattern, and a sidewall connecting the first stairway structure and the second stairway structure and disposed in the insulating region.

In an embodiment, a three-dimensional memory device may include: a first semiconductor structure including a peripheral circuit; and a second semiconductor structure disposed on the first semiconductor structure, the second semiconductor structure including: a source plate disposed on the first semiconductor structure; first and second isolation patterns disposed on the source plate, extending in a first direction, and adjacent to each other in a second direction intersecting with the first direction; a stack disposed between the first isolation pattern and the second isolation pattern, and including a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses includes a first stairway structure connected to the first isolation pattern, a second stairway structure connected to the second isolation pattern, and a sidewall connecting the first stairway structure and the second stairway structure and disposed in the insulating region.

In an embodiment, a three-dimensional memory device may include: a first semiconductor structure having a peripheral circuit and a first bonding layer including a plurality of first bonding pads connected to the peripheral circuit; and a second semiconductor structure bonded to the first semiconductor structure, the second semiconductor structure including: a second bonding layer including a plurality of second bonding pads bonded to the plurality of first bonding pads; first and second isolation patterns disposed on the second bonding layer, extending in a first direction, and adjacent to each other in a second direction intersecting with the first direction; a stack disposed between the first isolation pattern and the second isolation pattern, and including a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses includes a first stairway structure connected to the first isolation pattern, a second stairway structure connected to the second isolation pattern, and a sidewall connecting the first stairway structure and the second stairway structure and disposed in the insulating region.

According to the embodiments of the disclosed technology, it is possible to provide a three-dimensional memory device with improved degree of integration and reliability.

BRIEF DESCRIPTION OF THE DRAWINGS

FIG. 1 is a layout diagram of a three-dimensional memory device according to an embodiment of the present disclosure.

FIGS. 8 and 9 are layout diagrams of three-dimensional memory devices according to embodiments of the present disclosure.

DETAILED DESCRIPTION

Figure 2:
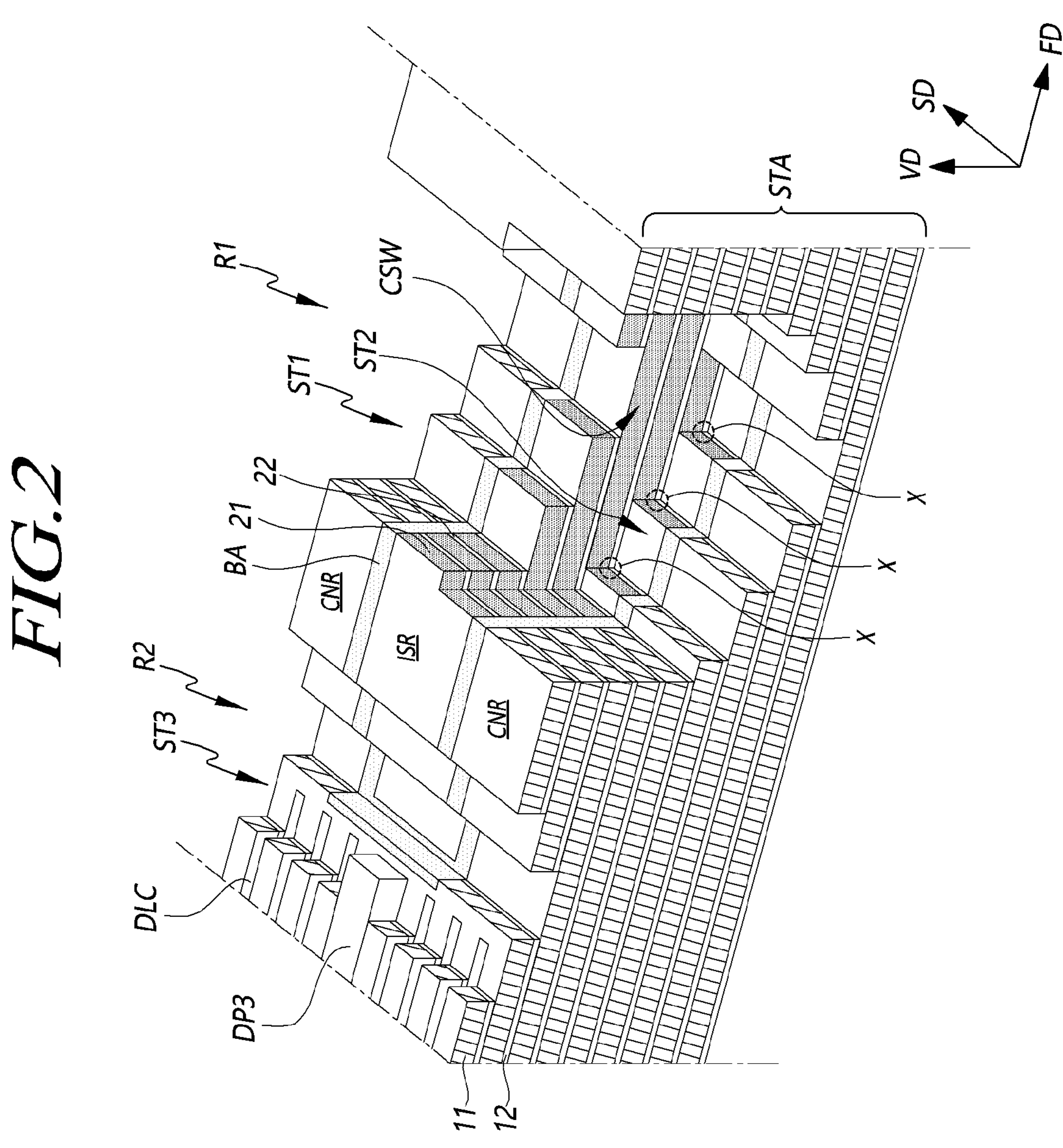
FIG. 2 is a perspective view illustrating first and second stairway-shaped recesses of FIG. 1.

Hereinafter, embodiments of the present disclosure will be described in detail with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an" and "the," this may include a plural of that noun unless specifically stated otherwise.

Also, in describing the components of the disclosure, there may be terms used like first, second, A, B, (a), and (b). These are solely for the purpose of differentiating one component from another component but do not limit the substances, order, sequence or number of the components.

In descriptions for the positional relationships of components, in the case where it is described that at least two components are "connected," "coupled" or "linked," it is to be understood that the at least two components may be directly "connected," "coupled" or "linked" but may be indirectly "connected," "coupled" or "linked" with another component interposed between the two components. Here, another component may be included in at least one of the at least two components which are "connected," "coupled" or "linked" with each other.

In descriptions for time flow relationships of components, an operating method or a fabricating method, in the case where pre and post relationships in terms of time or pre and post relationships in terms of flow are described, for example, by "after," "following," "next" or "before," non-continuous cases may be included unless "immediately" or "directly" is used.

In the case where a numerical value for a component or its corresponding information is mentioned, even though there is no separate explicit description, the numerical value or its corresponding information can be interpreted as including an error range that may be caused by various factors (for example, a process variable, an internal or external shock, noise, etc.).

Hereinafter, various embodiments of the present disclosure will be described in detail with reference to the accompanying drawings. In the accompanying drawings, a direction vertically projecting from a top surface of a substrate is defined as a vertical direction VD, and two directions parallel to the top surface of the substrate and intersecting with each other are defined as a first direction FD and a second direction SD, respectively. The first direction FD and the second direction SD may substantially perpendicularly intersect with each other. In the drawings, a direction indicated by an arrow and a direction opposite thereto represent the same direction.

FIG. 1 is a layout diagram of a three-dimensional memory device according to an embodiment of the present disclosure.

Referring to FIG. 1, the three-dimensional memory device according to the embodiment of the present disclosure may include first and second isolation patterns DP1 and DP2, a stack STA, and first and second stairway-shaped recesses R1 and R2.

The first and second isolation patterns DP1 and DP2 may extend in the first direction FD, and may be adjacent to or spaced apart each other in the second direction SD crossing with the first direction FD. The first direction FD and the second direction SD may cross perpendicularly to each other. The first direction FD may be the extending direction of word lines, and the second direction SD may be the extending direction of bit lines.

The first and second isolation patterns DP1 and DP2 may include an insulating layer. For another example, at least a portion of the first and second isolation patterns DP1 and DP2 may function as a common source line. In this case, although not illustrated, at least the portion of the first and second isolation patterns DP1 and DP2 may include a conductive layer which serves as the common source line. An insulating layer may be configured between the conductive layer and the stack STA to isolate the conductive layer and the stack STA.

The stack STA may be disposed between the first isolation pattern DP1 and the second isolation pattern DP2. The first and second isolation patterns DP1 and DP2 may be disposed on both sides, respectively, of the stack STA in the second direction SD. The stack STA may configure one memory block.

Although only two isolation patterns DP1 and DP2 and one stack STA are illustrated in the drawing, a plurality of stacks may be arranged in the second direction SD, and an isolation pattern may be disposed between two stacks which are adjacent to or spaced apart from each other.

The stack STA may include a cell array region CAR, a connection region CNR which extends from the cell array region CAR in the first direction FD, and an insulating region ISR which is surrounded by the connection region CNR.

As will be described later with reference to FIGS. 2 and 3, the cell array region CAR and the connection region CNR may include a plurality of electrode layers which are stacked in the vertical direction VD. The plurality of electrode layers may include a plurality of word line layers and a plurality of select line layers. The plurality of select line layers may include, for example, at least one top select line layer which is disposed above the plurality of word line layers and at least one bottom select line layer which is disposed below the plurality of word line layers.

When viewed from the top, the insulating region ISR may have a line shape which traverses the center portion of the stack STA in the first direction FD. The insulating region ISR may be disposed as one row in the stack STA. Although the present disclosure illustrates a case where one insulating region ISR is configured in one stack STA, the present disclosure is not limited thereto. A plurality of insulating regions may be disposed in a line in the first direction FD at the center portion of the stack STA.

The connection region CNR may include bridge parts BP which are disposed on both sides of the insulating region ISR in the second direction SD. The bridge parts BP have a reduced width due to the presence of the insulating region ISR. In an embodiment of the present disclosure, since the insulating region ISR is disposed as a single row in the single stack STA, the bridge parts BP may be disposed as two rows.

A barrier structure BA which surrounds the insulating region ISR may be configured between the insulating region ISR and the connection region CNR to isolate the insulating region ISR and the connection region CNR. The insulating region ISR may be defined by the barrier structure BA.

A plurality of supports SP may be configured in the connection region CNR of the stack STA. The plurality of supports SP may be configured in the bridge parts BP of the connection region CNR. The supports SP may pass through the connection region CNR of the stack STA in the vertical direction VD. The supports SP may serve to support the stack STA to prevent the stack STA from collapsing or bending during a manufacturing process.

Third isolation patterns DP3, top select line cuts DLC and bottom select line cuts SLC may be configured in the stack STA.

When viewed from the top, the third isolation patterns DP3 may extend in the first direction FD on both sides of the insulating region ISR. The third isolation patterns DP3 may be spaced apart from the insulating region ISR.

Although not illustrated, the third isolation patterns DP3 may vertically pass through the stack STA. Each word line layer may include a connecting portion in a region where the third isolation pattern DP3 and the insulating region ISR are spaced apart from each other. Each word line layer may include two word line fingers which are distinguished by the third isolation patterns DP3 and the insulating region ISR. The two word line fingers may be connected to each other through the connecting portion. The word line layer may configure a word line.

When viewed from the top, the top select line cuts DLC may be disposed between the first isolation pattern DP1 and the third isolation pattern DP3 and between the second isolation pattern DP2 and the third isolation pattern DP3, may extend in the first direction FD, and may be arranged in the second direction SD.

Although not illustrated, the top select line cuts DLC may vertically pass through the top select line layer. By the third isolation pattern DP3 and the top select line cuts DLC, the top select line layer may be divided into a plurality of top select lines, for example, eight top select lines. The top select lines may configure drain select lines.

When viewed from the top, the bottom select line cuts SLC may be connected between the third isolation patterns DP3 and the insulating region ISR. Although not illustrated, the bottom select line cuts SLC may vertically pass through the bottom select line layer. By the third isolation patterns DP3, the bottom select line cuts SLC and the insulating region ISR, the bottom select line layer may be divided into two bottom select lines. The bottom select lines may configure source select lines.

The first and second stairway-shaped recesses R1 and R2 may be configured in the insulating region ISR and the connection region CNR. The first and second stairway-shaped recesses R1 and R2 may be arranged in the first direction FD. Although the present embodiment illustrates two stairway-shaped recesses, the present disclosure is not limited thereto. A plurality of stairway-shaped recesses may be provided in the insulating region ISR and the connection region CNR in the first direction FD.

A plurality of row connection contacts XCT which are connected to the electrode layers may be disposed in the connection region CNR of the stack STA. The row connection contacts XCT may vertically extend from the connection region CNR of the stack STA. The row connection contacts XCT may be arranged in the connection region CNR of the stack STA in the first direction FD. In an embodiment of the present disclosure, the row connection contacts XCT may be disposed in a plurality of rows in the second direction SD.

A plurality of through contacts TCT1 and TCT2 may be configured in the insulating region ISR of the stack STA. The through contacts TCT1 and TCT2 may pass through the insulating region ISR of the stack STA in the vertical direction VD. The through contacts TCT1 and TCT2 may provide vertical interconnections which pass through a three-dimensional memory cell array in the vertical direction VD, to contribute to decreasing a metal level and reducing a die size.

The through contacts TCT1 and TCT2 may be disposed in a plurality of rows in the second direction SD. An embodiment of the present disclosure illustrates a case where the through contacts TCT1 and TCT2 are disposed in two rows, but the present disclosure is not limited thereto. Hereinafter, for the sake of convenience in explanation, the through contacts TCT1 of a first row will be defined as first through contacts, and the through contact TCT2 of a second row will be defined as second through contacts.

A plurality of cell plugs CP may be configured in the cell array region CAR. The plurality of cell plugs CP may pass through the cell array region CAR in the vertical direction VD. The plurality of cell plugs CP may be disposed in a plurality of rows in the second direction SD. Cell plugs CP of odd-numbered rows and cell plugs CP of even-numbered rows may be offset relative to each other due to the zigzag pattern in the first direction FD. Due to this fact, a greater number of cell plugs CP may be disposed within the same area to achieve a higher integration.

According to an embodiment of the present disclosure, since the insulating region ISR is configured as one row in one stack STA and the bridge parts BP of the connection region CNR are configured as two rows, the number of the barrier structure BA and the supports SP disposed on the same line in the second direction SD may be minimized. Since the number of components disposed on the same line in the second direction SD is small, the pitch of a memory block in the second direction SD may be configured to have a small size.

FIG. 2 is a perspective view illustrating first and second stairway-shaped recesses of FIG. 1.

Referring to FIG. 2, the connection region CNR may include a plurality of electrode layers 11 and a plurality of first interlayer insulating layers 12 which are alternately stacked in the vertical direction VD. The insulating region ISR may include a plurality of horizontal insulating layers 21 and a plurality of second interlayer insulating layers 22 which are alternately stacked in the vertical direction VD.

The first stairway-shaped recess R1 may include a first stairway structure ST1 and a second stairway structure ST2 which are arranged in the second direction SD, and a sidewall CSW which connects the first stairway structure ST1 and the second stairway structure ST2.

Each of the first and second stairway structures ST1 and ST2 may include a plurality of steps. When viewed from the top, steps included in each of the first and second stairway structures ST1 and ST2 may be disposed in a line in the first direction FD. When viewed from the top, the first stairway structure ST1 and the second stairway structure ST2 may be adjacent to each other in the second direction SD.

The first stairway structure ST1 and the second stairway structure ST2 may be located at different height levels, and may be connected to each other through the sidewall CSW. The sidewall CSW may be disposed in the insulating region ISR.

As illustrated in X portions of FIG. 2, triple points may be generated at the boundary between the sidewall CSW and the second stairway structure ST2. Each triple point represents a point where the horizontal surface of the second stairway structure ST2, the vertical surface of the second stairway structure ST2 and the sidewall CSW meet. Etch residue may accumulate around the triple point during an etching process for forming the second stairway structure ST2. In a subsequent process, the etch residue may be replaced with a conductive material to produce conductive foreign matter.

Unlike the present disclosure, when the sidewall CSW is disposed in the connection region CNR, a defect in which upper and lower electrode layers 11 are shorted by the conductive foreign matter produced around the triple point may occur. In the embodiment of the present disclosure, the sidewall CSW is disposed in the insulating region ISR so that the triple point is located in the insulating region ISR, and therefore, it is possible to prevent upper and lower electrode layers 11 from being shorted by the conductive foreign matter produced around the triple point.

The second stairway-shaped recess R2 may include a third stairway structure ST3. The third stairway structure ST3 may include a plurality of steps. When viewed from the top, the steps of the third stairway structure ST3 may be disposed in a line in the first direction FD.

Figure 3:
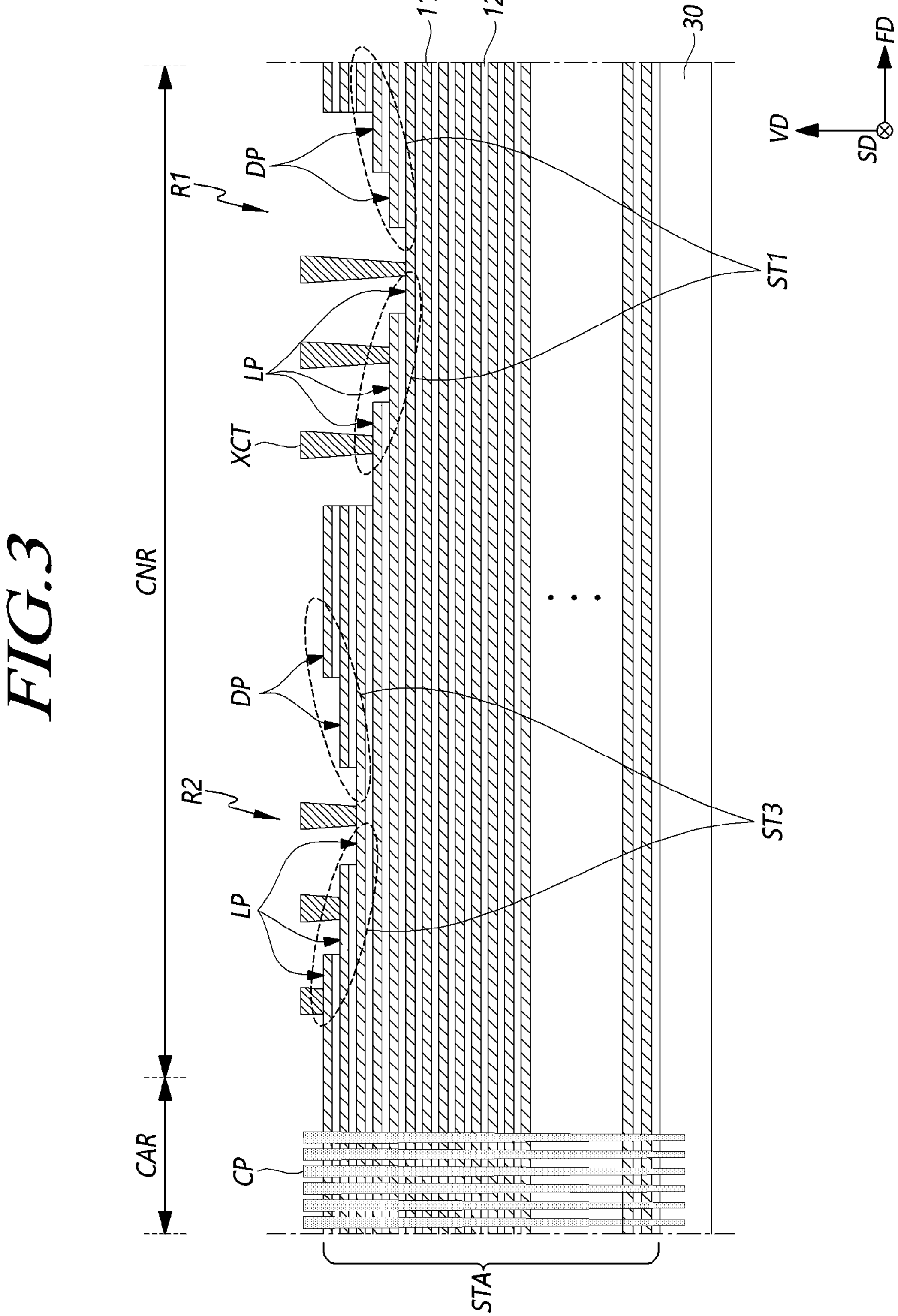
FIG. 3 is a cross-sectional view taken along line A of FIG. 1.
Figure 4:
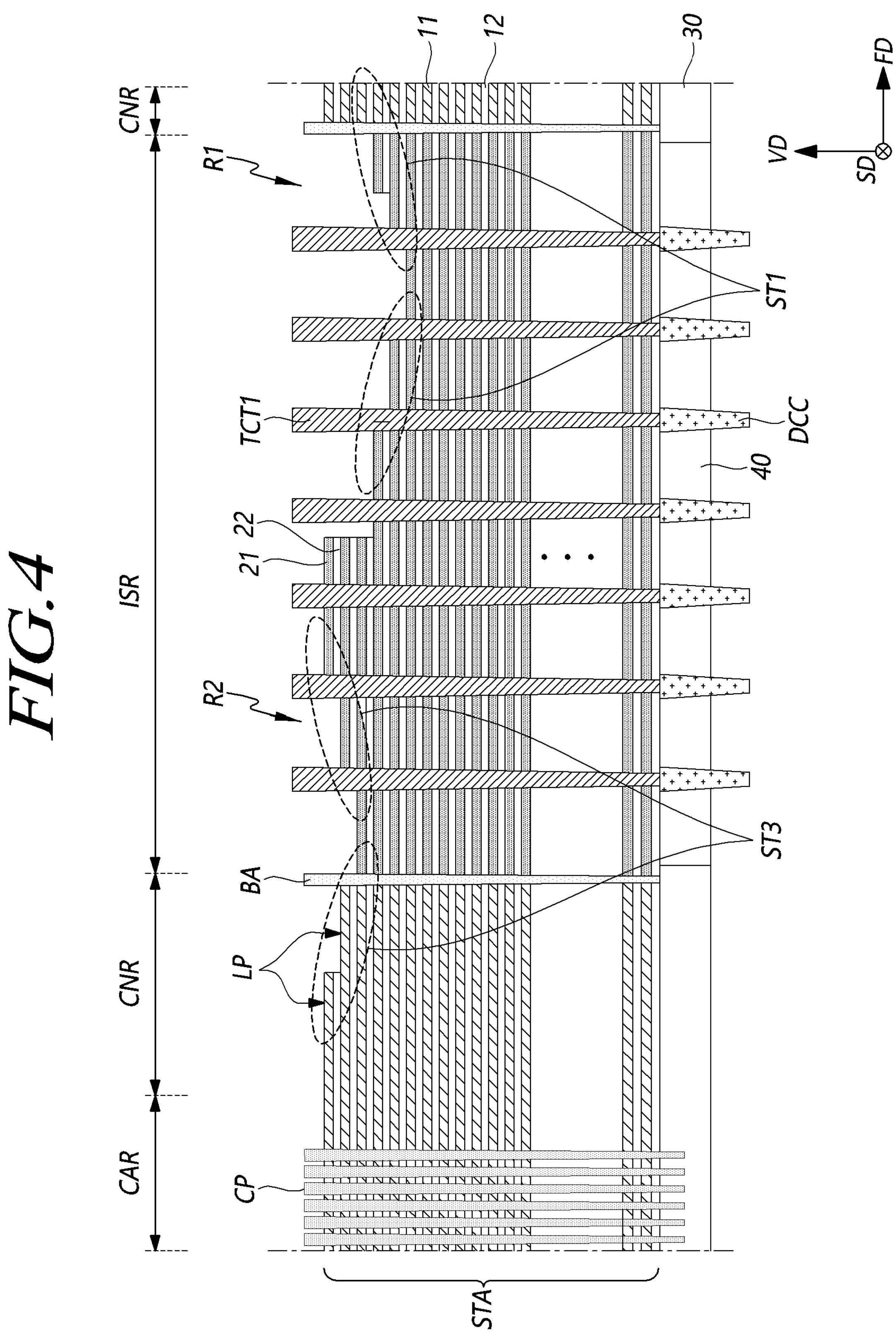
FIG. 4 is a cross-sectional view taken along line B of FIG. 1.
Figure 5:
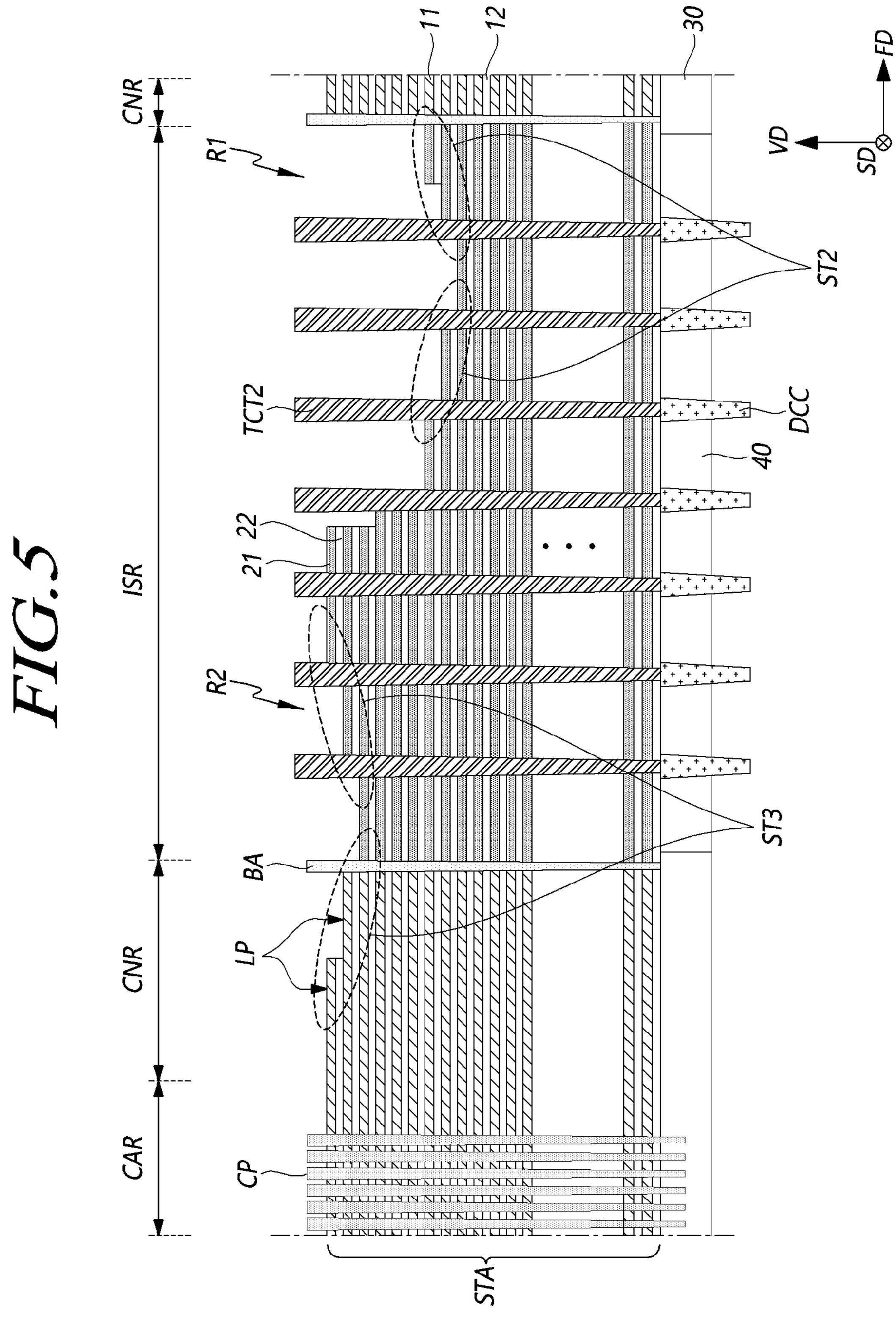
FIG. 5 is a cross-sectional view taken along line C of FIG. 1.
Figure 6:
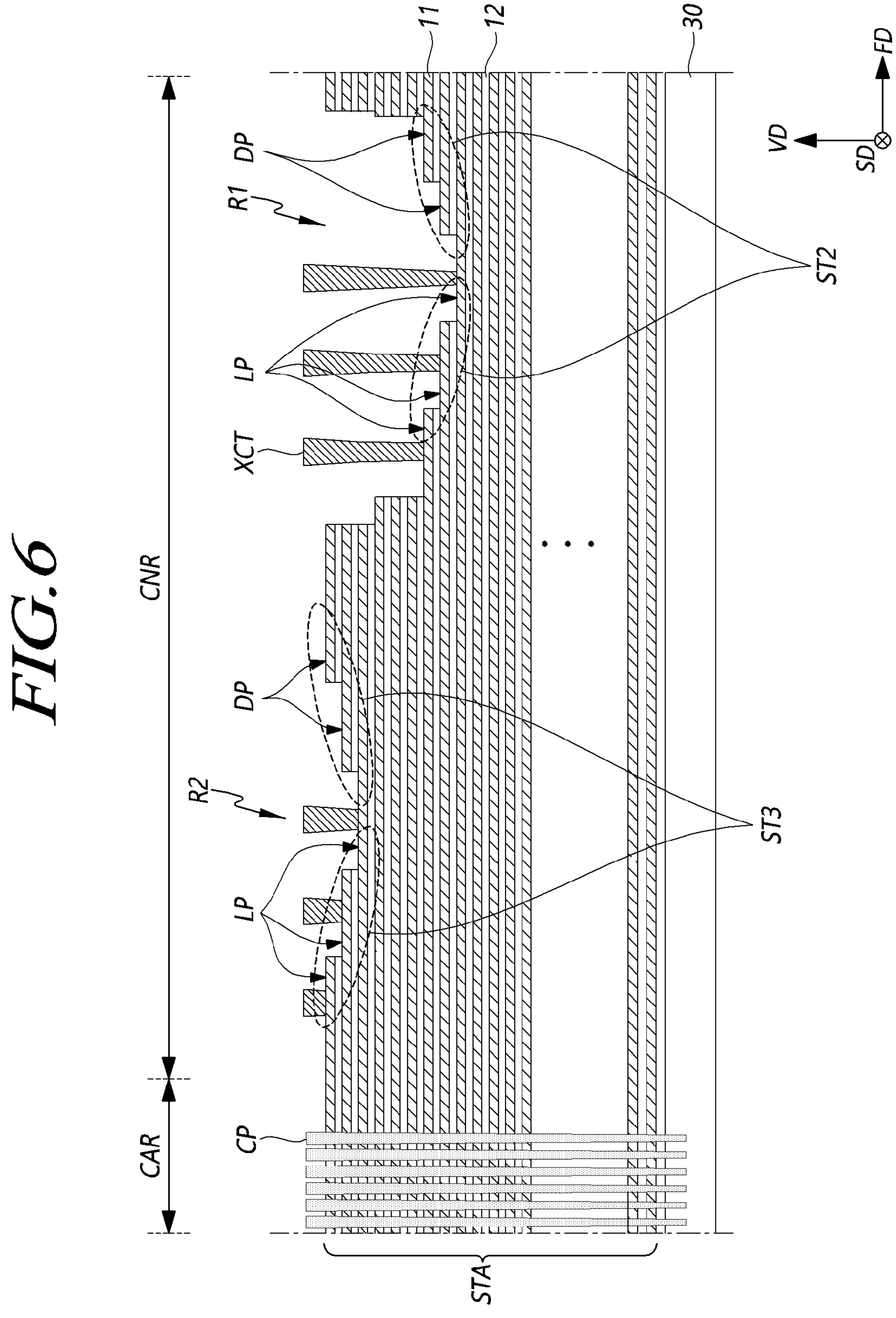
FIG. 6 is a cross-sectional view taken along line D of FIG. 1.
Figure 7:
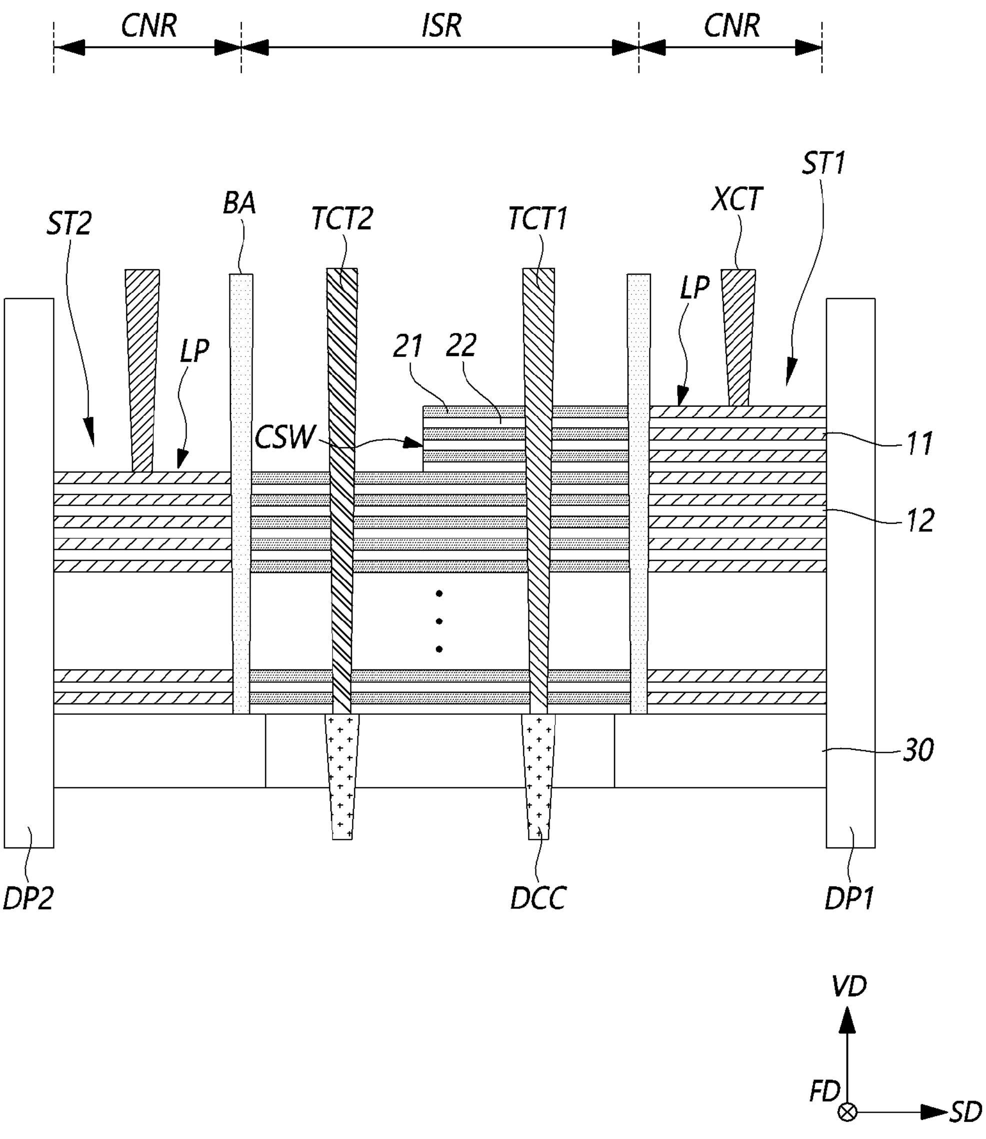
FIG. 7 is a cross-sectional view taken along line E of FIG. 1.

FIG. 3 is a cross-sectional view taken along the line A of FIG. 1, FIG. 4 is a cross-sectional view taken along the line B of FIG. 1, FIG. 5 is a cross-sectional view taken along the line C of FIG. 1, FIG. 6 is a cross-sectional view taken along the line D of FIG. 1, and FIG. 7 is a cross-sectional view taken along the line E of FIG. 1.

For the sake of simplicity in illustration, the illustration of the supports SP (see FIG. 1) is omitted in FIGS. 3 and 6.

Referring to FIGS. 3 to 7, the cell array region CAR and the connection region CNR may include the plurality of electrode layers 11 and the plurality of first interlayer insulating layers 12 which are alternately stacked on a source plate 30 in the vertical direction VD. The electrode layers 11 may include at least one selected from among a semiconductor (e.g., doped silicon), a metal (e.g., tungsten, copper or aluminum), a conductive metal nitride (e.g., titanium nitride or tantalum nitride) and a transition metal (e.g., titanium or tantalum). The first interlayer insulating layers 12 may include silicon oxide.

As described above, the electrode layers 11 may include a plurality of word lines, a top select line and a bottom select line. The plurality of word lines may include main word lines which are connected to main cells used for storing data and dummy word lines which are connected to dummy cells not used for storing data.

Although not illustrated, the source plate 30 may include a plurality of source layers. An isolation layer may be disposed between adjacent source layers to isolate the plurality of source layers.

The source plate 30 may be configured to overlap with the cell array region CAR and the connection region CNR in the vertical direction VD and not overlap with at least a portion of the insulating region ISR in the vertical direction VD. An insulating pattern 40 may be disposed under the insulating region ISR which does not overlap with the source plate 30 in the vertical direction VD.

The plurality of cell plugs CP may pass through the cell array region CAR in the vertical direction VD.

Although not illustrated, the cell plug CP may include a channel layer and a gate dielectric layer. The channel layer may include polysilicon or monocrystalline silicon, and may include, in some regions thereof, a P-type impurity such as boron (B). The gate dielectric layer may have a shape which surrounds the outer wall of the channel layer. The gate dielectric layer may include a tunnel insulating layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A main cell may be configured in a portion or an area where the main word line surrounds a cell plug CP, and a dummy cell may be configured in a portion or an area where the dummy word line surrounds a cell plug CP. A bottom select transistor may be configured in a portion or an area where the bottom select line surrounds a cell plug CP, and a top select transistor may be configured in a portion or an area where the top select line surrounds a cell plug CP.

The first stairway structure ST1 and the second stairway structure ST2 in the first stairway-shaped recesses R1 may be disposed in the second direction SD between the first isolation pattern DP1 and the second isolation pattern DP2. The first stairway structure ST1 may be connected to the first isolation pattern DP1, and the second stairway structure ST2 may be connected to the second isolation pattern DP2. As described above with reference to FIG. 2, the first stairway structure ST1 and the second stairway structure ST2 may be disposed at different height levels in the vertical direction VD, and may be connected to each other through the sidewall CSW disposed in the insulating region ISR.

The third stairway structure ST3 in the second stairway-shaped recesses R2 may be configured between the first isolation pattern DP1 and the second isolation pattern DP2, and may be connected to the first isolation pattern DP1 and the second isolation pattern DP2.

The third stairway structure ST3 may be generated using an etching process called an X-slim process. The X-slim process may include a process of forming a mask pattern having a line-shaped opening extending in the second direction SD, an etching process of etching a portion exposed by the opening to a thickness corresponding to the vertical pitch of the horizontal insulating layers 21, a slimming process of widening the width of the opening by reducing the width of the mask pattern, and a process of alternately repeating the etching process and the slimming process. The vertical pitch of the horizontal insulating layers 21 may correspond to the sum of the thickness of one horizontal insulating layer 21 and the thickness of one second interlayer insulating layer 22.

The first stairway structure ST1 may be generated using etching processes called an X-slim process and a Z-slim process. After a stairway structure is formed through the X-slim process, as the stairway structure generated through the X-slim process is transferred downward through the Z-slim process, the first stairway structure ST1 may be generated.

The Z-slim process may include a process of forming a mask pattern exposing a region including the stairway structure generated by the X-slim process, and a process of etching an area exposed by the mask pattern by a first depth. The first depth may correspond to k (k is an integer equal to or greater than 2) times the vertical pitch of the horizontal insulating layers 21. For example, the present disclosure illustrates a case where k is 3.

The second stairway structure ST2 may be generated using etching processes called an X-slim process, a Z-slim process and a Y-slim process. After the first stairway structure ST1 is generated by the X-slim process and the Z-slim process, as a part of the first stairway structure ST1 contacting the second isolation pattern DP2 is transferred downward by the Y-slim process, the second stairway structure ST2 may be generated.

The Y-slim process may include a process of forming a mask pattern exposing a region including the part of the first stairway structure ST1 contacting the second isolation pattern DP2, and a process of etching an area exposed by the mask pattern by a second depth. The second depth may correspond to m (m is an integer equal to or greater than 2) times the vertical pitch of the horizontal insulating layers 21. Accordingly, the second stairway structure ST2 may be located below the first stairway structure ST1 by the second depth. For example, the present disclosure illustrates a case where m is 3.

The sidewall CSW which connects the first stairway structure ST1 and the second stairway structure ST2 may be generated by the Y-slim process. The height of the sidewall CSW may be the same as the etch depth of the Y-slim process, that is, the second depth. The Y-slim process may be performed so that the sidewall CSW is generated in the insulating region ISR.

Each of the first to third stairway structures ST1 to ST3 may include a pair of stairway parts. The pair of stairway parts included in each of the first to third stairway structures ST1 to ST3 may be disposed to face each other in the first direction FD. Pad regions LP of the electrode layers 11 may be disposed in any one of the pair of stairway parts included in each of the first to third stairway structures ST1 to ST3, and dummy pad regions DP of the electrode layers 11 may be disposed in the other of the pair of stairway parts.

The row connection contacts XCT may be connected to the pad regions LP of the electrode layers 11, respectively. No row connection contact XCT is connected to each dummy pad region DP.

Although the present embodiment illustrates a case where the slope of the stairway part including the dummy pad regions DP is the same as the slope of the stairway part including the pad regions LP, the present disclosure is not limited thereto. The stairway part including the dummy pad regions DP may be configured to have a steeper slope than the stairway part including the pad regions LP.

The pad region LP should have a width of at least a predetermined size in order to be connected to the row connection contact XCT, but the dummy pad region DP may have a smaller width since the dummy pad region DP is not connected to the row connection contact. By configuring the dummy pad region DP to have a smaller width than the pad region LP in the first direction FD, the stairway part including the dummy pad regions DP may have a steeper slope than the stairway part including the pad regions LP. By this fact, the widths of the first to third stairway structures ST1 to ST3 in the first direction FD may be reduced.

The barrier structure BA may vertically pass through the stack STA between the insulating region ISR and the connection region CNR. The lower end of the barrier structure BA may be connected to the source plate 30.

In an embodiment of the present disclosure, a plurality of horizontal insulating layers and a plurality of interlayer insulating layers are alternately stacked in the vertical direction VD. And then, the horizontal insulating layers of the cell array region CAR and the connection region CNR are removed and a conductive material is filled in spaces where the horizontal insulating layers are removed to generate the electrode layers. The barrier structure BA may serve as an etch barrier which prevents the horizontal insulating layers of the insulating region ISR from being removed or lost during a process of removing the horizontal insulating layers of the cell array region CAR and the connection region CNR. In addition, the barrier structure BA may also serve to support the stack STA to prevent the stack STA from collapsing or bending during a manufacturing process.

The barrier structure BA may be configured by an insulating material with an etch selectivity different from that of the horizontal insulating layers 21. For example, the horizontal insulating layers 21 may be configured by nitride, and the barrier structure BA may be configured by oxide.

The plurality of through contacts TCT1 and TCT2 may pass through the insulating region ISR in the vertical direction VD. The lower ends of the through contacts TCT1 and TCT2 may be connected to the insulating pattern 40. A plurality of conductive contact plugs DCC which vertically pass through the insulating pattern 40 may be defined under the through contacts TCT1 and TCT2 to be connected to the through contacts TCT1 and TCT2, respectively.

The through contacts TCT1 and TCT2 may be configured by a conductive material. For example, the through contacts TCT1 and TCT2 may be configured by tungsten (W) with excellent step coverage. Since the through contacts TCT1 and TCT2 pass through the insulating region ISR, the through contacts TCT1 and TCT2 may not include insulating spacers. As the through contacts TCT1 and TCT2 do not include insulating spacers, the manufacturing cost may be reduced by omitting a processing step for forming the insulating spacers. Furthermore, since a reduction in the cross-sectional area of a conductor configuring the through contacts TCT1 and TCT2 due to the presence of the insulating spacers is not caused, low resistance of the through contacts TCT1 and TCT2 may be achieved.

As will be described later with reference to FIGS. 12 and 13, the three-dimensional memory device may include a peripheral circuit and a plurality of external connection pads. The three-dimensional memory device may be provided with power and signals through the external connection pads from an external device. The first through contacts TCT1 may connect the external connection pads and the peripheral circuit, and may transfer power and signals provided from the external device, to the peripheral circuit through the external connection pads.

Each of the second through contacts TCT2 may be connected to the row connection contact XCT through an interconnection pattern not illustrated herein, and may be connected to the electrode layer 11 through the row connection contact XCT. The second through contacts TCT2 may be connected to the peripheral circuit, and may serve to transfer operating voltages from the peripheral circuit, to the electrode layers 11.

Figure 8:
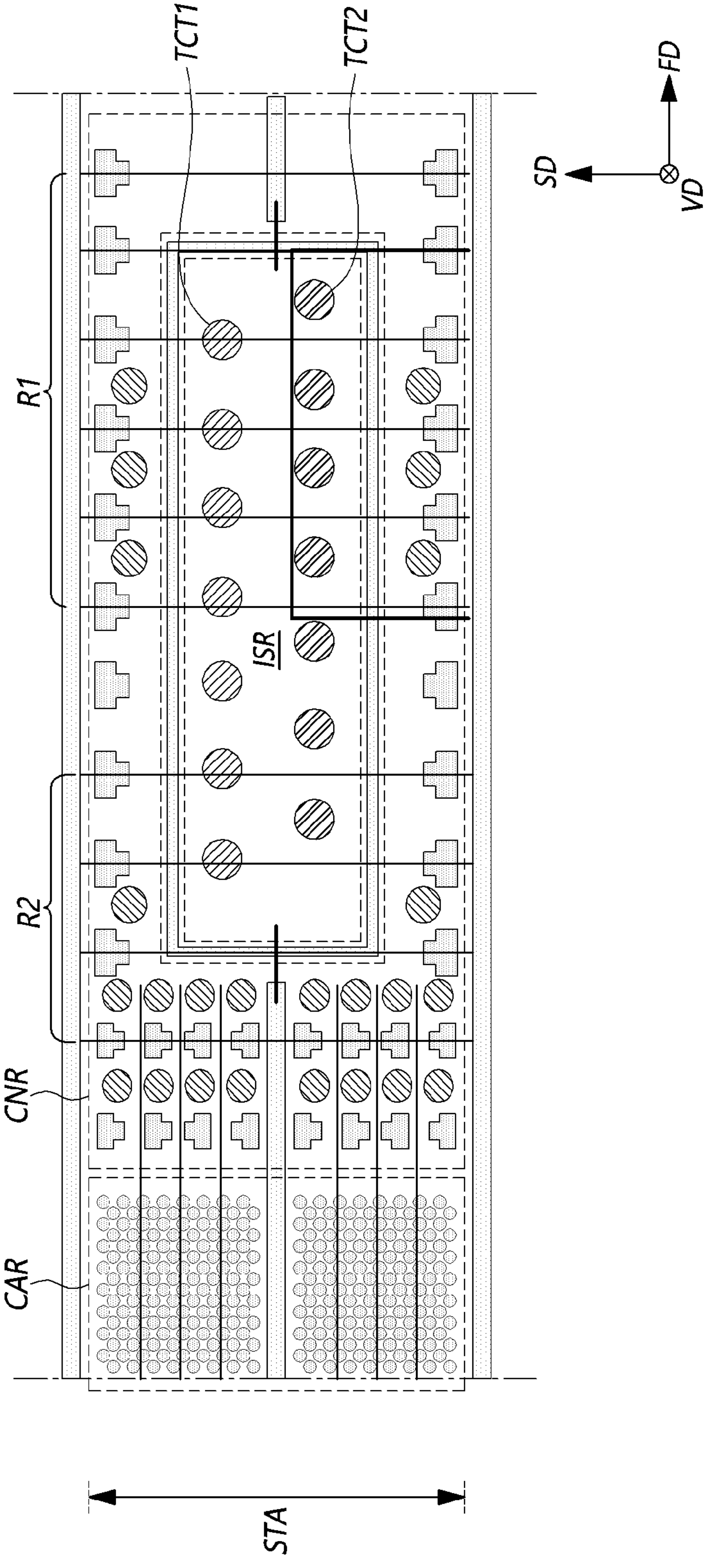

FIG. 8 is a layout diagram of a three-dimensional memory device according to an embodiment of the present disclosure.

Referring to FIG. 8, the first through contacts TCT1 and the second through contacts TCT2 may be offset relative to each other in the first direction FD. The first through contacts TCT1 and the second through contacts TCT2 may not overlap with each other in the second direction SD.

During a manufacturing process of the memory device, conductive foreign matter may be produced along the vertical surfaces of the steps defined in the first and second stairway-shaped recesses R1 and R2 due to process defects. When the first through contact TCT1 and the second through contact TCT2 are disposed on the same line in the second direction SD, a defect in which the first through contact TCT1 and the second through contact TCT2 are shorted by the conductive foreign matter may occur.

According to the present embodiment, by disposing the first through contacts TCT1 and the second through contacts TCT2 disposed in different rows to be offset relative to each other in the first direction FD, it is possible to suppress or prevent the first through contact TCT1 and the second through contact TCT2 from being shorted.

Figure 10:
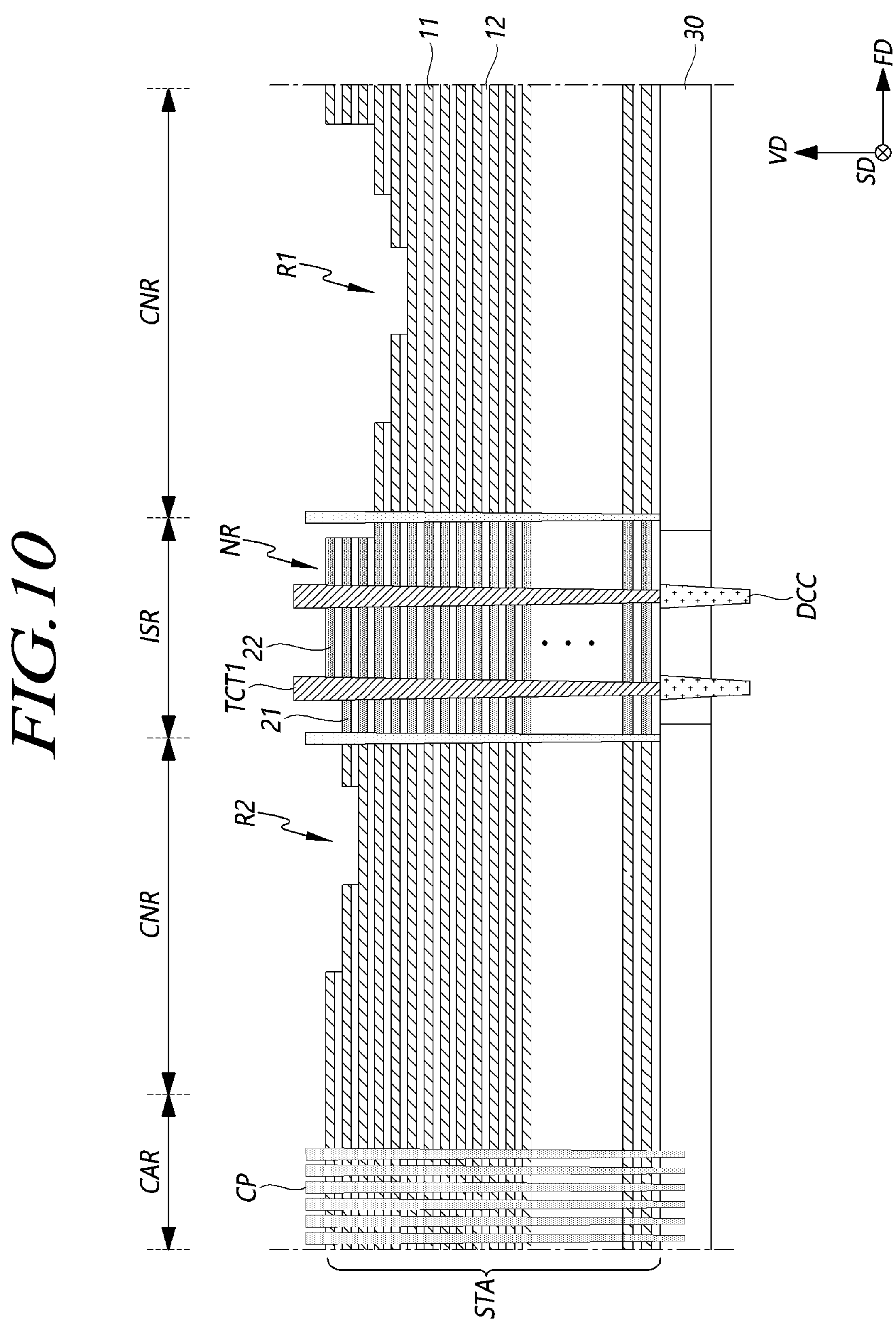
FIG. 10 is a cross-sectional view taken along line F of FIG. 9.

FIG. 9 is a layout diagram of a three-dimensional memory device according to an embodiment of the present disclosure, and FIG. 10 is a cross-sectional view taken along the line F of FIG. 9.

Referring to FIG. 9, the insulating region ISR may include a line part LPP and protruding parts PP which protrude from the line part LPP toward the first and second isolation patterns DP1 and DP2. Although the present disclosure illustrates a case where the insulating region ISR includes the protruding parts PP which protrude toward the first and second isolation patterns DP1 and DP2 in the second direction SD, the present disclosure is not limited thereto. The insulating region ISR may include at least one protruding part PP which protrudes from the line part LPP toward at least one of the first and second isolation patterns DP1 and DP2.

The first through contacts TCT1 may pass through the protruding parts PP, and the second through contacts TCT2 may pass through the line part LPP. The first through contacts TCT1 and the second through contacts TCT2 may be offset relative to each other in the first direction FD.

Referring to FIGS. 9 and 10, the protruding parts PP may be configured in a region including a non-recess region NR between the first stairway-shaped recess R1 and the second stairway-shaped recess R2. Since the protruding parts PP through which the first through contacts TCT1 pass are configured in the region including the non-recess region NR, the conditions of a contact hole etching process for forming the first through contacts TCT1 may be uniformized, and thus, a process defect that may occur during the etching process may be reduced.

Figure 11:
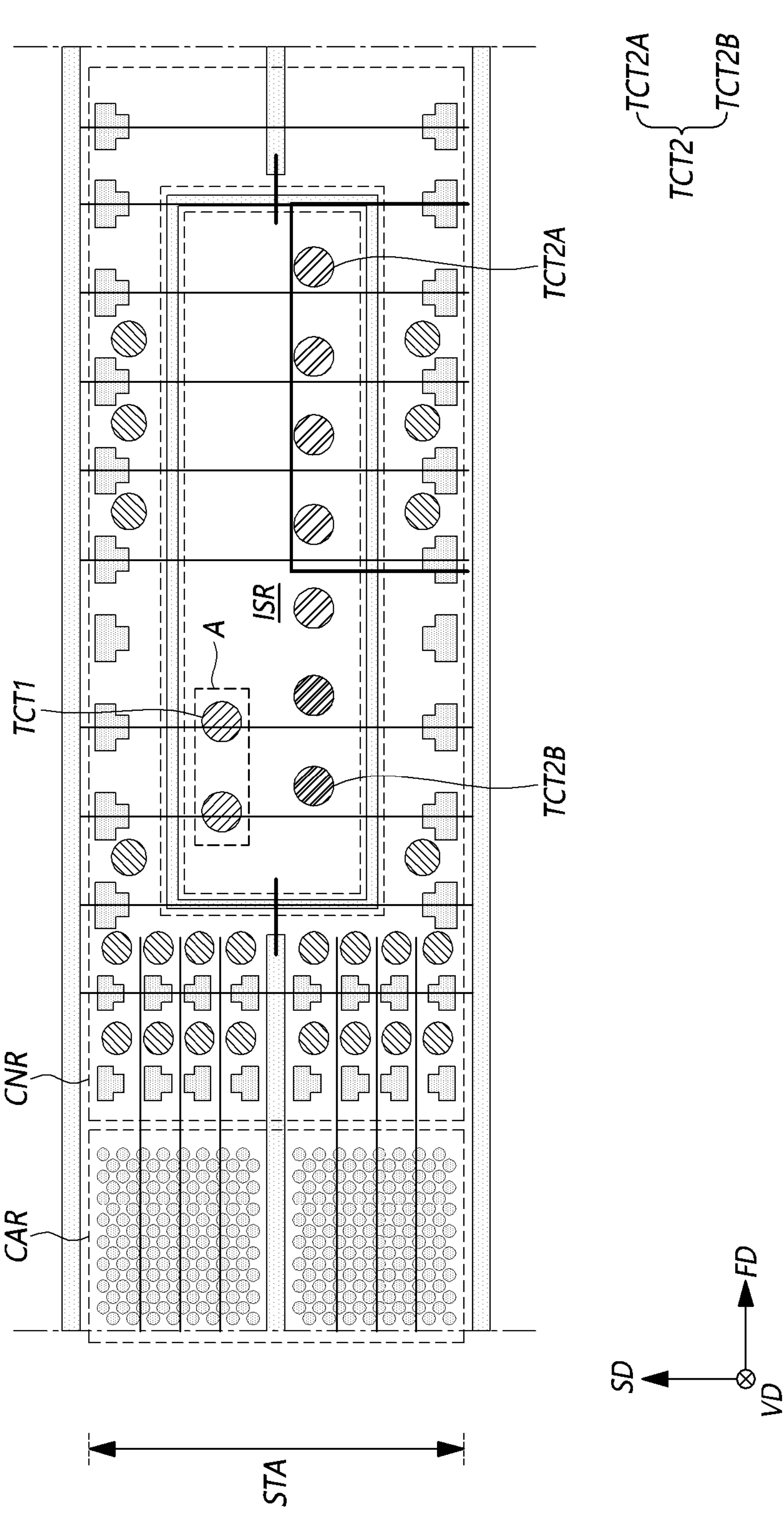
FIG. 11 is a layout diagram of a three-dimensional memory device according to an embodiment of the present disclosure.

FIG. 11 is a layout diagram of a three-dimensional memory device according to an embodiment of the present disclosure.

Referring to FIG. 11, the second through contacts TCT2 may include main through contacts TCT2A and dummy through contacts TCT2B.

As described above, word lines may include a main word line which is connected to main cells and a dummy word line which is connected to dummy cells. The main through contacts TCT2A may serve to electrically connect the main word line and the peripheral circuit. The dummy through contacts TCT2B may serve to electrically connect the dummy word line and the peripheral circuit. As described above, the first through contacts TCT1 may transfer power and signals provided from the external device, to the peripheral circuit.

The main through contacts TCT2A may be disposed in a region separated, in a diagonal direction crossing with the first direction FD and the second direction SD, from a region A where the first through contacts TCT1 are disposed. The dummy through contact TCT2B may be disposed in a region adjacent, in the second direction SD, to the region A where the first through contacts TCT1 are disposed.

Due to coupling between the first through contacts TCT1 and the main through contacts TCT2A, the voltage of the main through contacts TCT2A may change under the influence of the voltages of the first through contacts TCT1, and thus, an error may occur in a data read or write operation.

According to the present embodiment, when the main through contacts TCT2A are disposed in the region diagonally separated from the region A where the first through contacts TCT1 are disposed, the distance between the main through contacts TCT2A and the first through contacts TCT1 may increase, and coupling may decrease. Therefore, since influence of the voltages of the first through contacts TCT1 exerted on the voltage of the main through contacts TCT2A decreases, it is possible to reduce an error of a data storage and/or read operation.

The dummy through contacts TCT2B may be disposed in the region adjacent, in the second direction SD, to the region A where the first through contacts TCT1 are disposed. Since the dummy through contacts TCT2B serve to transfer an operating voltage to the dummy word lines which are not involved in storing data, even when the voltage of the dummy through contacts TCT2B changes by coupling between the dummy through contacts TCT2B and the first through contacts TCT1, an error of a data storage and/or read operation will not occur. Accordingly, by disposing the dummy through contacts TCT2B in the region adjacent, in the second direction SD, to the region A where the first through contacts TCT1 are disposed, the efficiency of using an area may be increased.

A three-dimensional memory device according to an embodiment of the present disclosure may be provided as a peripheral under cell (PUC) structure or a peripheral over cell (POC) structure.

Figure 12:
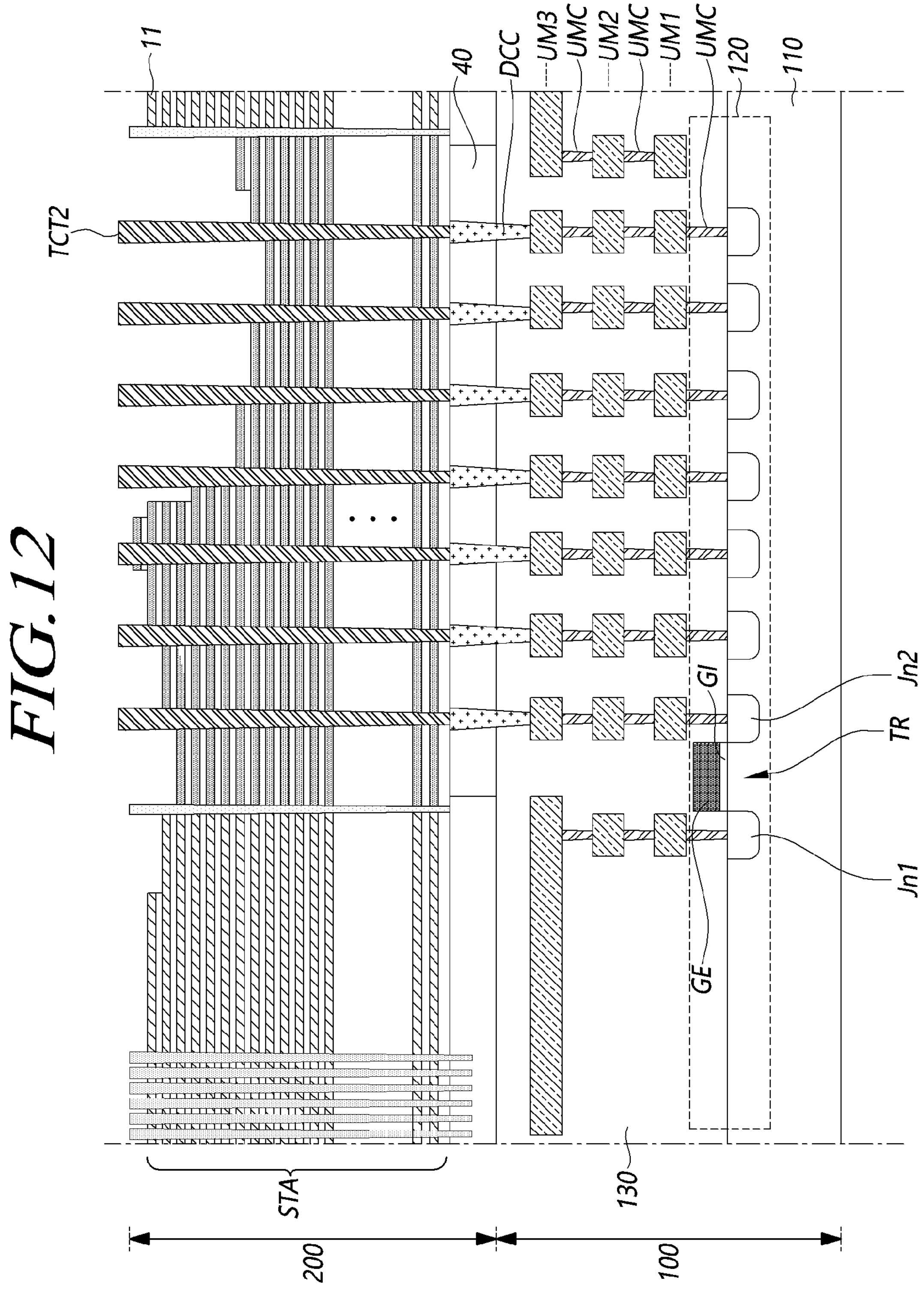
FIGS. 12 and 13 are cross-sectional views of three-dimensional memory devices according to embodiments of the present disclosure.
Figure 13:
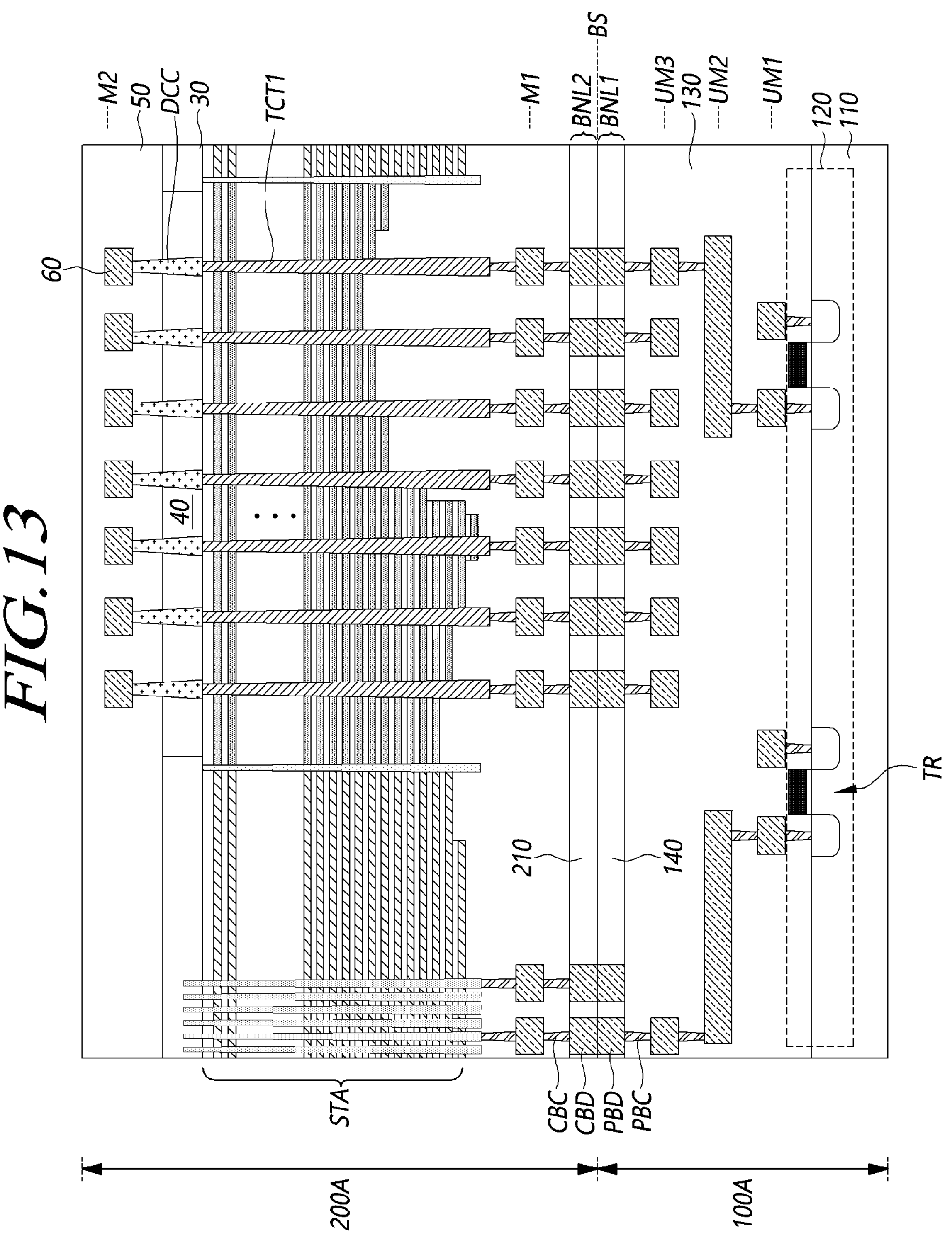

FIGS. 12 and 13 are cross-sectional views of three-dimensional memory devices according to embodiments of the present disclosure.

Referring to FIG. 12, the three-dimensional memory device according to the embodiment of the present disclosure may have a PUC structure. In detail, the three-dimensional memory device may include a first semiconductor structure 100 and a second semiconductor structure 200 which is built up on the first semiconductor structure 100. That is to say, after first forming the first semiconductor structure 100, the second semiconductor structure 200 may be formed on the first semiconductor structure 100.

The second semiconductor structure 200 may include a memory cell array, and the first semiconductor structure 100 may include a peripheral circuit which controls the operation of the memory cell array. For example, the peripheral circuit may include, but is not limited to, a row decoder, a page buffer circuit, a voltage generator and a control circuit.

The first semiconductor structure 100 may include a substrate 110, a peripheral circuit 120, an insulating layer 130, a plurality of bottom interconnection layers UM1 to UM3 and a plurality of bottom contacts UMC.

The substrate 110 may include at least one selected from the group including a monocrystalline silicon layer, an SOI (silicon on insulator), a silicon layer formed on a silicon germanium (SiGe) layer, a monocrystalline silicon layer formed on an insulating layer and a polysilicon layer formed on an insulating layer.

The peripheral circuit 120 may include a transistor TR. The transistor TR may include a gate dielectric layer GI which is defined on the substrate 110, a gate electrode GE which is defined on the gate dielectric layer GI, and junction regions Jn1 and Jn2 which are formed by implanting impurity ions into an active region on both sides of the gate electrode GE. One of the junction regions Jn1 and Jn2 may be used as a source region of the transistor TR, and the other of the junction regions Jn1 and Jn2 may be used as a drain region of the transistor TR.

The insulating layer 130 may be disposed on the substrate 110 to cover transistors TR.

The bottom interconnection layers UM1 to UM3 may be disposed in the insulating layer 130. For example, the bottom interconnection layers UM1 to UM3 may include a first bottom interconnection layer UM1, a second bottom interconnection layer UM2 over the first bottom interconnection layer UM1, and a third bottom interconnection layer UM3 over the second bottom interconnection layer UM2. While FIG. 12 illustrates a case where three bottom interconnection layers UM1 to UM3 are included, it is to be noted that the present disclosure is not limited thereto. The number of bottom interconnection layers may be two or at least four.

A plurality of interconnection patterns may be disposed in each of the bottom interconnection layers UM1 to UM3. Interconnection patterns of the bottom interconnection layers UM1 to UM3 may be configured to have properties that may not exhibit a process defect, for example, a hillock, at a maximum temperature (hereinafter, referred to as a 'process critical temperature') during a process of forming a memory cell array. In other words, as a material for the interconnection patterns of the bottom interconnection layers UM1 to UM3, a conductive material which has a heat resistance characteristic at the process critical temperature may be used. For example, the interconnection patterns of the bottom interconnection layers UM1 to UM3 may include a material which has a melting point higher than the process critical temperature, for example, tungsten (W). Since the bottom interconnection layers UM1 to UM3 are formed before forming the memory cell array, the interconnection patterns of the bottom interconnection layers UM1 to UM3 may be formed using a conductive material which has a high resistivity but has a high melting point.

The peripheral circuit 120 and the interconnection patterns of the bottom interconnection layers UM1 to UM3 may be connected to each other through the bottom contacts UMC.

The second semiconductor structure 200 may be disposed on the insulating layer 130 of the first semiconductor structure 100. The second semiconductor structure 200 may include the three-dimensional memory device described above with reference to FIGS. 1 to 11.

Conductive contact plugs DCC may pass through an insulating pattern 40 and the insulating layer 130, and may be connected to the interconnection patterns of the bottom interconnection layer UM3. The conductive contact plugs DCC may be connected to the bottoms of second through contacts TCT2, and may connect the second through contacts TCT2 and the interconnection patterns of the bottom interconnection layer UM3.

Although not illustrated, top interconnections may be defined on the second through contacts TCT2, and may be connected to the second through contacts TCT2. The second through contacts TCT2 may be connected to row connection contacts (XCT of FIG. 7) through the top interconnections, and may be connected to electrode layers 11 which are connected to the row connection contacts (XCT of FIG. 7).

Referring to FIG. 13, the three-dimensional memory device according to the embodiment of the present disclosure may have a POC structure. In other words, a first semiconductor structure 100A and a second semiconductor structure 200A may be fabricated on different wafers and be then coupled by being bonded to each other.

Referring to FIG. 13, the first semiconductor structure 100A may further include a first bonding layer BNL1 compared to the first semiconductor structure 100 of FIG. 12.

In detail, the first semiconductor structure 100A may include a substrate 110, a peripheral circuit 120 which is defined on the substrate 110, the first bonding layer BNL1, and a plurality of bottom interconnection layers UM1 to UM3 which are disposed between the substrate 110 and the first bonding layer BNL1.

An insulating layer 130 may be defined on the substrate 110 to cover the peripheral circuit 120. The plurality of bottom interconnection layers UM1 to UM3 may be disposed in the insulating layer 130.

Interconnection patterns of the bottom interconnection layers UM1 to UM3 may include, for example, at least one of aluminum (Al) and copper (Cu). Because the interconnection patterns of the bottom interconnection layers UM1 to UM3 are formed on a wafer separate from a memory cell array, a material configuring the interconnection patterns of the bottom interconnection layers UM1 to UM3 may be selected without considering the thermal budget of a process for forming the memory cell array. As a material configuring the interconnection patterns of the bottom interconnection layers UM1 to UM3, aluminum (Al), copper (Cu) or the like having a low resistivity may be selected. By this fact, the resistance of the interconnection patterns of the bottom interconnection layers UM1 to UM3 may be reduced.

The first bonding layer BNL1 may include a plurality of first bonding pads PBD and a first bonding insulating pattern 140 which insulates the first bonding pads PBD from each other. First bonding contacts PBC may be defined between the first bonding layer BNL1 and the third bottom interconnection layer UM3 to connect the first bonding pads PBD and the interconnection patterns of the third bottom interconnection layer UM3.

Compared to the second semiconductor structure 200 of FIG. 12, the second semiconductor structure 200A may further include a second bonding layer BNL2, an insulating layer 50, and first and second top interconnection layers M1 and M2.

The second bonding layer BNL2 may include a plurality of second bonding pads CBD and a second bonding insulating pattern 210 which insulates the second bonding pads CBD from each other.

The second bonding layer BNL2 of the second semiconductor structure 200A may be bonded to the first bonding layer BNL1 of the first semiconductor structure 100A in a face-to-face manner at a bonding interface BS. The bonding interface BS may be configured between the first bonding layer BNL1 and the second bonding layers BNL2, as a result of hybrid bonding that is also referred to as direct bonding and may simultaneously configure a metal-metal bond and a dielectric-dielectric bond. At the bonding interface BS, the plurality of first bonding pads PBD and the plurality of second bonding pads CBD may be bonded to each other to configure a plurality of conductive bonds, and the first bonding insulating pattern 140 and the second bonding insulating pattern 210 may be bonded to each other to configure an insulating bond.

The first top interconnection layer M1 may be disposed between the second bonding layer BNL2 and a stack STA. Although the present embodiment illustrates a case where the number of top interconnection layers disposed between the second bonding layer BNL2 and the stack STA is one, the present disclosure is not limited thereto. The number of top interconnection layers disposed between the second bonding layer BNL2 and the stack STA may be at least one. The second bonding pads CBD may be connected to interconnection patterns of the first top interconnection layer M1 through second bonding contacts CBC.

The insulating layer 50 may be disposed on a source plate 30 and an insulating pattern 40. The second top interconnection layer M2 may be disposed in the insulating layer 50. Conductive contact plugs DCC may pass through the insulating pattern 40 and the insulating layer 50, and may be connected to interconnection patterns 60 of the second top interconnection layer M2.

Although not illustrated, external connection pads may be disposed on the second top interconnection layer M2. The external connection pad may be connected to a first through contact TCT1 through the interconnection pattern 60 of the second top interconnection layer M2 and the conductive contact plug DCC, and may be connected to the peripheral circuit 120 through the interconnection pattern of the first top interconnection layer M1 connected to the first through contact TCT1, the second bonding contact CBC, the second bonding pad CBD, the first bonding pad PBD, the first bonding contact PBC, the interconnection patterns of bottom interconnection layers UM1 to UM3, and bottom contacts UMC. The first through contact TCT1 may form an electrical path which connects the peripheral circuit 120 of the first semiconductor structure 100A and the external connection pad.

Although exemplary embodiments of the present disclosure have been described for illustrative purposes, those skilled in the art will appreciate that various modifications, additions and substitutions are possible, without departing from the scope and spirit of the present disclosure. Therefore, the embodiments disclosed above and in the accompanying drawings should be considered in a descriptive sense only and not for limiting the technological scope. The technological scope of the present disclosure is not limited by the embodiments and the accompanying drawings.

What is claimed is:

1. A three-dimensional memory device comprising:

first and second isolation patterns extending in a first direction, and adjacent to each other in a second direction intersecting with the first direction;

a stack disposed between the first isolation pattern and the second isolation pattern that comprises a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses comprises a first stairway structure connected to the first isolation pattern, a second stairway structure connected to the second isolation pattern, and a sidewall connecting the first stairway structure and the second stairway structure and disposed in the insulating region.

2. The three-dimensional memory device according to claim 1, wherein the insulating region is configured as a single row in the stack.

3. The three-dimensional memory device according to claim 1, wherein the insulating region has, when viewed from a top, a line shape that extends in the first direction.

4. The three-dimensional memory device according to claim 1, further comprising:

a plurality of through contacts passing through the insulating region in the vertical direction, and disposed in at least two rows in the second direction.

5. The three-dimensional memory device according to claim 4, wherein through contacts disposed in different rows are offset relative to each other in the first direction.

6. The three-dimensional memory device according to claim 1, wherein the insulating region comprises:

a line part extending in the first direction when viewed from a top; and a protruding part extending from the line part toward at least one of the first isolation pattern and the second isolation pattern.

7. The three-dimensional memory device according to claim 6, wherein the protruding part is disposed in a region including a non-recess region.

8. The three-dimensional memory device according to claim 6, wherein the sidewall is disposed in the line part.

9. The three-dimensional memory device according to claim 6, further comprising:

a first through contact passing through the protruding part in the vertical direction; and a second through contact passing through the line part in the vertical direction.

10. The three-dimensional memory device according to claim 9, wherein the first through contact and the second through contact are offset relative to each other in the first direction.

11. A three-dimensional memory device comprising:

a first semiconductor structure including a peripheral circuit; and a second semiconductor structure disposed on the first semiconductor structure, the second semiconductor structure comprising:

a source plate disposed on the first semiconductor structure;

first and second isolation patterns disposed on the source plate, extending in a first direction, and adjacent to each other in a second direction intersecting with the first direction;

a stack disposed between the first isolation pattern and the second isolation pattern, and including a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses comprises a first stairway structure connected to the first isolation pattern, a second stairway structure connected to the second isolation pattern, and a sidewall connecting the first stairway structure and the second stairway structure and disposed in the insulating region.

12. The three-dimensional memory device according to claim 11, further comprising:

a plurality of through contacts passing through the insulating region in the vertical direction, wherein the plurality of through contacts are disposed in at least two rows in the second direction.

13. The three-dimensional memory device according to claim 12, wherein through contacts disposed in different rows are offset relative to each other in the first direction.

14. The three-dimensional memory device according to claim 12, wherein the second semiconductor structure further comprises a plurality of external connection pads, wherein the plurality of through contacts comprise:

a plurality of first through contacts connecting the plurality of external connection pads and the peripheral circuit; and a plurality of second through contacts connecting the plurality of electrode layers and the peripheral circuit, and wherein the plurality of first through contacts and the plurality of second through contacts are disposed in different rows.

15. The three-dimensional memory device according to claim 14, wherein the plurality of electrode layers comprise a main word line and a dummy word line, the plurality of second through contacts comprise a main through contact that is connected to the main word line, and the main through contact is disposed in a region adjacent, in a diagonal direction, to a region where the plurality of first through contacts are disposed.

16. The three-dimensional memory device according to claim 15, wherein the plurality of second through contacts further comprise a dummy through contact that is connected to the dummy word line, and the dummy through contact is disposed in a region adjacent, in the second direction, to a region where the plurality of first through contacts are disposed.

17. A three-dimensional memory device comprising:

a first semiconductor structure having a peripheral circuit and a first bonding layer including a plurality of first bonding pads connected to the peripheral circuit; and a second semiconductor structure bonded to the first semiconductor structure, the second semiconductor structure comprising:

a second bonding layer including a plurality of second bonding pads bonded to the plurality of first bonding pads;

first and second isolation patterns disposed on the second bonding layer, extending in a first direction, and adjacent to each other in a second direction intersecting with the first direction;

a stack disposed between the first isolation pattern and the second isolation pattern, and including a connection region including a plurality of electrode layers and a plurality of interlayer insulating layers alternately stacked in a vertical direction and an insulating region surrounded by the connection region; and a plurality of stairway-shaped recesses configured in the insulating region and the connecting region, and arranged in the first direction, wherein at least one of the plurality of stairway-shaped recesses comprises a first stairway structure connected to the first isolation pattern, a second stairway structure connected to the second isolation pattern, and a sidewall connecting the first stairway structure and the second stairway structure and disposed in the insulating region.

18. The three-dimensional memory device according to claim 17, further comprising:

a plurality of through contacts passing through the insulating region in the vertical direction, wherein the plurality of through contacts are disposed in at least two rows in the second direction.

19. The three-dimensional memory device according to claim 18, wherein through contacts disposed in different rows are offset relative to each other in the first direction.

20. The three-dimensional memory device according to claim 18, wherein the second semiconductor structure further comprises an external connection pad, and at least one of the plurality of through contacts is configured to connect the external connection pad and the peripheral circuit.

* * * * *